(12) United States Patent
Effing (10) Patent No.: US 10,153,795 B1
(45) Date of Patent: Dec. 11, 2018

(54) SWITCHING AMPLIFIER CIRCUIT WITH AMPLITUDE CONTROL

(71) Applicant: NXP B.V., Eindhoven (NL)

(72) Inventor: Hermanus Johannes Effing, Overasselt (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 15/900,051

(22) Filed: Feb. 20, 2018

(51) Int. Cl.
*H04B 1/04* (2006.01)
*H03F 3/217* (2006.01)
*H03F 3/193* (2006.01)

(52) U.S. Cl.
CPC .......... *H04B 1/0475* (2013.01); *H03F 3/193* (2013.01); *H03F 3/2171* (2013.01); *H04B 1/0458* (2013.01); *H03F 2200/451* (2013.01); *H04B 2001/0408* (2013.01); *H04B 2001/0491* (2013.01)

(58) Field of Classification Search
CPC ................ H04B 1/0475; H04B 1/0458; H04B 2001/0408; H04B 2001/0491; H04B 5/0081; H04B 5/0018; H04W 52/52; H03F 3/193; H03F 3/2171; H03F 2200/451
See application file for complete search history.

(56) References Cited

U.S. PATENT DOCUMENTS

| | | | |
|---|---|---|---|
| 4,841,281 A * | 6/1989 | Melvin, Jr. ......... | H02J 13/0034 340/12.33 |
| 5,982,231 A | 11/1999 | Nalbant | |
| 6,130,562 A * | 10/2000 | Bosch ................. | H01S 5/042 327/109 |
| 6,150,880 A | 11/2000 | Schweighofer | |
| 6,229,388 B1 | 5/2001 | Nalbant | |
| 6,356,151 B1 | 3/2002 | Nalbant | |
| 6,388,514 B1 | 5/2002 | King et al. | |
| 6,469,919 B1 | 10/2002 | Bennett | |
| 6,492,868 B2 | 12/2002 | Kirn | |
| 6,509,793 B2 | 1/2003 | Kim | |
| 6,545,533 B2 | 4/2003 | Karki et al. | |
| 6,593,807 B2 | 7/2003 | Groves, Jr. et al. | |

(Continued)

OTHER PUBLICATIONS

D. Mansour et. Al. "Unconstrained Frequency Domain Adaptive Filter", IEEE Transactions on ASSP, vol. 30, No. 5, 1982.

(Continued)

*Primary Examiner* — Andrew Wendell (57) ABSTRACT

An amplifier circuit including opposing-phase electronic switches, and an output drive circuit that provides an output drive signal in response to output signals from the opposing-phase electronic switches. Each of the opposing-phase electronic are configured and arranged to rapidly switch back and forth in response to an amplifier input signal and based on a power source defined to provide a supply voltage to the switching amplifier circuit. Further, an output-amplitude control circuit is used to limit a maximum-achievable voltage that is applied (e.g., gate or source voltage) to at least one of the opposing-phase electronic switches, with each such applied voltage being less than the supply voltage provided by the power source. Consistent therewith, more specific aspects concern an arrangement or circuit-based system of wireless communication in an automobile, wherein an automotive battery is the power source.

16 Claims, 3 Drawing Sheets

(56) References Cited

U.S. PATENT DOCUMENTS

| | | |
|---|---|---|
| 6,603,353 B2 | 8/2003 | Ishida |
| 6,621,336 B1 | 9/2003 | Johnson |
| 6,763,114 B1 | 7/2004 | Nalbant |
| 6,771,120 B2 | 8/2004 | Kim |
| 6,819,177 B2 | 11/2004 | Ruha et al. |
| 6,885,567 B2 | 4/2005 | Lincoln et al. |
| 6,937,090 B2 | 8/2005 | Kim |
| 7,038,534 B2 | 5/2006 | Hanzlik |
| 7,173,483 B2 | 2/2007 | Ho et al. |
| 7,180,758 B2 | 2/2007 | Lincoln et al. |
| 7,265,612 B2 | 9/2007 | Ho et al. |
| 7,265,613 B2 | 9/2007 | Ho et al. |
| 7,355,948 B2 | 4/2008 | Kao et al. |
| 7,397,676 B2 | 7/2008 | Lincoln et al. |
| 7,400,191 B2 | 7/2008 | Rodriguez |
| 7,492,217 B2 | 2/2009 | Hansen et al. |
| 7,705,672 B1 | 4/2010 | Rodriguez |
| 7,869,497 B2 | 1/2011 | Benvenuto et al. |
| 8,344,801 B2 | 1/2013 | Owen et al. |
| 8,823,457 B1 | 9/2014 | Mossawir et al. |
| 8,995,691 B2 | 3/2015 | French et al. |
| 9,467,313 B2 | 10/2016 | Ganzerli et al. |
| 9,509,261 B2 | 11/2016 | Buono et al. |
| 9,559,642 B2 | 1/2017 | Olson et al. |
| 9,654,310 B1 | 5/2017 | Chang |
| 9,667,201 B2 | 5/2017 | Du et al. |
| 2006/0164149 A1* | 7/2006 | Leistner ............... H03D 7/1433 327/359 |
| 2006/0217086 A1* | 9/2006 | Mekechuk ............ H03F 1/0205 455/126 |
| 2006/0217089 A1* | 9/2006 | Snelgrove ................ H03F 1/02 455/127.2 |
| 2007/0298732 A1* | 12/2007 | Lee ....................... H04L 27/362 455/102 |
| 2013/0057319 A1* | 3/2013 | Liu ..................... H04L 25/0272 327/108 |
| 2014/0285258 A1* | 9/2014 | Du ........................ H03F 3/2171 330/10 |

OTHER PUBLICATIONS

D. Falconer et. Al, "Frequency Domain Equalization for Single-Carrier Broadband Wireless Systems", IEEE Communication Magazine, 2002, pp. 58-66.

S. Haykin, "Adaptive Filter Theory: Third Edition", Prentice Hall, 1996, Chapter 10, Frequency Domain Adaptive Filters.

C. A. Belfiore et al., "Decision Feedback Equalization", Proceedings of the IEEE, 1979, vol. 67, Issue: 8, pp. 1143-1156.

D. Godard, "Self-Recovering Equalization and Carrier Tracking in Two-Dimensional Data Communication Systems", IEEE Transactions on Communications, vol. 28, No. 11, 1980.

Y. Zu et. Al, "Single Carrier Frequency Domain Equalization with Noise Prediction for Broadband Wireless Systems", IEEE Global Telecommunications Conference, 2004, vol. 5, pp. 3098-3102.

N. Benvenuto et. Al, "On the Comparison Between OFDM and Single Carrier Modulation With a DFE Using a Frequency-Domain Feedforward Filter", IEEE Transactions on Communications, 2002, vol. 50, No. 6.

* cited by examiner

SWITCHING AMPLIFIER CIRCUIT WITH AMPLITUDE CONTROL

OVERVIEW

Aspects of various embodiments are directed to the architecture and operation of a switching amplifier circuit.

An appreciation of such performance might be best understood using the specific example of a switching amplifier in which the acquisition and reproduction of audio or low-frequency (LF) signals, involving some of the first applications of electronic circuits, continues to improve. Nowadays, switching amplifiers are ubiquitous and can be found in a variety of power electronics circuits in the automotive industries as well as many other portable applications. The vast majority of these electronics is in the form of integrated circuits.

A specific example of such an LF amplifier in an integrated circuit is a basic four-switch Class-D driver (or amplifier) design with output amplitude-control clamp circuitry in the form of regulators and diodes. In such driver designs, the four switches are commonly implemented as FETs (field-effect transistors) driven in common mode, with opposing-phase signals driving a pair of high-side FETs and a pair of low-side FETs. For some specific LF transmission systems, such as those providing automotive car access, it is required to control the load current over a wide range. A lower controllable load current is achieved by carefully-constructed arrangements of regulators and diodes for clamping the maximum gate and source voltages of the high-side switches. In this way, the output amplitude control provides limits on the maximum gate voltage of the high-side switches and forces them to operate in common drain (source-follower) mode in specific instances of operation, thereby effecting upper limits on certain of the voltages and on the output load current relative to desired current levels as would be set by the applied supply voltage and duty cycle of the switching.

While largely successful and acceptable for certain applications, these and other matters have presented challenges to the control and design of such amplification circuits for a variety of applications, including but not necessarily limited to those directed to LF transmission and other switched-power amplifier applications as mentioned above. These challenges involve somewhat complex designs, increase component count (and therefore costs), and require additional circuit-board real estate.

Various example embodiments are directed to issues such as those addressed above and/or others which may become apparent from the following disclosure. For example, according to certain embodiments, a switching amplifier feeds an output drive circuit that is coupled to an antenna load. The switching amplifier includes FET devices that rapidly switch back and forth in response to an input signal and based on a general (e.g., DC) power source. An output-amplitude control circuit is used to limit a maximum-achievable drive or control (e.g., gate/source) voltages internal to the switching amplifier, with each of the maximum-achievable drive voltages being less than the supply voltage provided by the power source.

In more specific embodiments, an amplifier circuit includes opposing-phase electronic switches, and an output drive circuit that provides an output drive signal in response to output signals from the opposing-phase electronic switches. Each of the opposing-phase electronic are configured and arranged to rapidly switch back and forth in response to an amplifier input signal and based on a power source defined to provide a supply voltage to the switching amplifier circuit. Further, an output-amplitude control circuit is used to limit a maximum-achievable applied (gate/source) voltage for at least one of the opposing-phase electronic switches, with each of the maximum-achievable gate voltage and the maximum-achievable source voltage being less than the supply voltage provided by the power source.

In more-specific example embodiments, aspects are directed to a wireless communication arrangement in which an amplifier (or transmitter) is driven by an automotive battery, and a key-fob circuit receives and responds to modulated signals wirelessly via an antenna. The arrangement further includes a switching amplifier circuit having opposing-phase electronic switches, each respectively configured and arranged to rapidly switch back and forth in response to an amplifier input signal and based on power defined relative to the power source, and an antenna drive circuit that generates the modulated signals to the key-fob circuit in response to output signals from the opposing-phase electronic switches. Further, an output-amplitude control circuit is used to provide an upper limit on applied control voltages (e.g., a maximum-achievable gate voltage and a maximum-achievable source voltage) for at least one of the opposing-phase electronic switches, wherein each such limited or maximum voltage is less than a supply voltage provided by the battery or derived power source.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of circuit-based apparatuses, systems and methods which use and control amplifiers by implementing signal amplification circuitry in the form of electronic switches and with a control circuit affecting or acting on the electronic switches and/or output-driver circuitry to control energy effectively corresponding to the ON-phase duration of the electronic switches' opposing-phase signals. In certain implementations, aspects of the present disclosure have been shown to be beneficial when used in the context of a Class-D amplifier and/or in connection with portable and automotive applications in the amplifiers drive antenna loads. While not necessarily so limited, various aspects may be appreciated through the following discussion of non-limiting examples which use exemplary contexts.

Accordingly, in the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Consistent with the instant disclosure, one specific example embodiment is directed to a circuit including a FET-based switching amplifier configured and arranged with an amplitude-control circuit to provide amplitude control to an LF driver (e.g., configured to drive an antenna load), so that the maximum gate voltage of the high side switches is limited to levels less than the voltage level of the power source supplying power to the circuit.

Another specific example embodiment is directed to an amplifier circuit including opposing-phase electronic switches, and an output drive circuit that provides an output drive signal in response to output signals from the opposing-phase electronic switches. Each of the opposing-phase electronic switches are configured and arranged to rapidly switch back and forth, subject to a controlled terminal-drive (gate) voltage, in response to an amplifier input signal and based on a power source defined to provide a supply voltage to the switching amplifier circuit. Further, an output-amplitude control circuit can be used to provide the controlled terminal voltage by limiting a maximum-achievable gate voltage and a maximum-achievable source voltage for at least one of the opposing-phase electronic switches, with each of the maximum-achievable gate voltage and the maximum-achievable source voltage being less than the supply voltage provided by the power source. In another more-specific embodiment, the above-discussed aspects can be used with common mode input and output signals and related circuitry for processing such common mode signals (as exemplified below in connection with the figures).

In a more specific embodiment, the above-characterized amplification circuit includes the opposing-phase electronic switches as part of a Class D amplifier which in some instances can be used as part of a larger circuit with the output from the amplifier feeding terminals of a impedance-based load such as an antenna load circuit with an inductor receiving current to transmit modulated signals wirelessly (inductively) for receipt by an antenna of another circuit. Optionally, voltage clamping circuitry can be used with the output-amplitude control circuit to prevent a source voltage to the opposing-phase electronic switches from exceeding a maximum threshold defined for the switching amplifier circuit, by absorbing current returned by the inductance in the antenna load circuit (e.g., in a four-FET (high side-low side) common-mode arrangement with the returned energy being absorbed by activation of one of both "low side" switches.

Certain aspects of the instant disclosure can be appreciated using a more-specific example embodiment in which such an amplification circuit drives wireless transmission in low-power environments and in which signal loss is susceptible to moderate levels of noise. One such environment is automotive electronics where one of what is typically many co-located automobiles include (disparate and/or similarly-constructed) wireless transmissions circuits where noise and signal interferences are concerns due to transmitted (modulated) signals competing in the same wireless spectrum and to the power supplies for such amplification circuits being sourced by automotive batteries. One practical scenario in this automotive context is where such wireless transmissions from each amplification circuit are implemented with a carrier frequency of at least ten kilohertz (10 kHz) for receipt and demodulation by a key-fob circuit. In this type of environment, one such application employs the above-characterized amplification circuitry arranged with an antenna load having an inductor through which the modulated carrier signals are sent wirelessly for receipt and demodulation by another circuit. While signal integrity can typically be enhanced by increasing signal power (e.g., signal-to-noise ratio), in this automotive environment minimizing signal power (without loss of signal integrity) can be important for various reasons including, for example, the on-going increase of dynamic range of LF transmission system (to increase the communication distance) and to mitigate the creation of unnecessary interference which would likely impact the wireless transmissions of other neighboring circuits.

Accordingly, the above-discussed output-amplitude control circuit is used to limit a maximum-achievable gate/source voltage used for driving and causing the ON state of one or more of the opposing-phase electronic switches such that the maximum-achievable voltage is set or programmed to be less than the supply voltage provided by the power source. Such setting or programming can be implemented in various ways and including, as examples, designing into the amplification circuit fixed components and/or a circuit permitting a selection of certain impedance-causing components to effect a known voltage drop (e.g., a series arrangement of diodes, transistors and/or the like having known voltage drops which accumulate to set a desired drop between two nodes). By limiting the maximum-achievable gate/source voltage used for driving and causing the ON state, signal power is minimized (noticeably lessened) without loss of signal integrity.

Figure 1A:
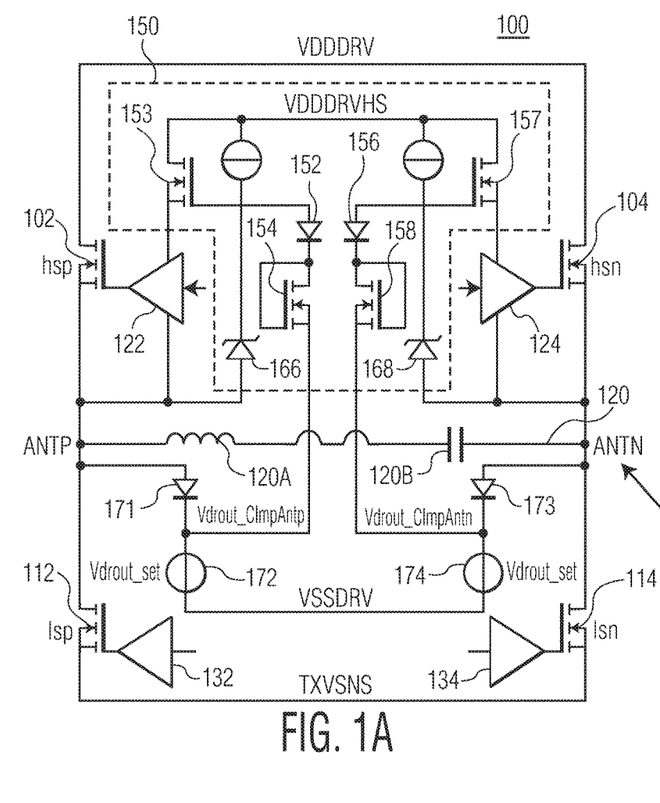
FIGS. 1A and 1B illustrate an example amplification circuit, in accordance with the present disclosure, with FIG. 1A conceptualizing, by way of exemplary control circuitry, LF-driver output amplitude control and with FIG. 1B illustrating relevant signals, in a graphical timing diagram, at selected terminals or nodes of FIG. 1A.
Figure 1B:
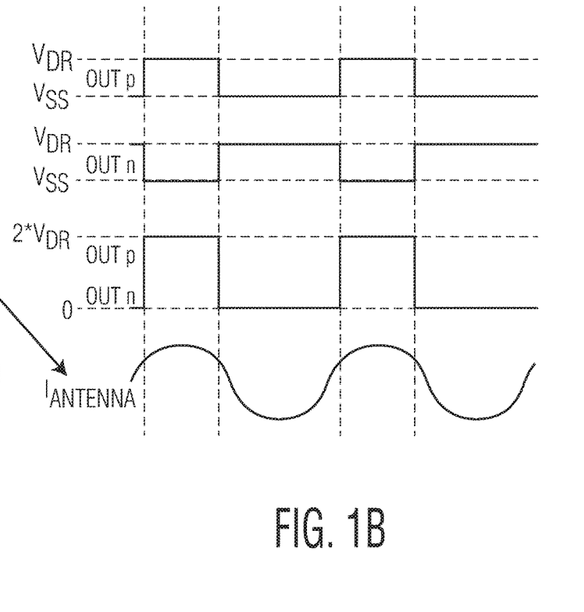

Consistent with the above-discussed aspects and example embodiment, FIGS. 1A and 1B depict yet another embodiment in the form of a block diagram (FIG. 1A) and a corresponding signal-timing diagram (FIG. 1B). In FIG. 1A, an amplifier circuit 100 is shown with for field-effect transistors (FETs, or NMOS FETs) including high-side transistors 102 and 104, and low-side transistors 112 and 114. These transistors are configured and arranged to switch with opposing phases for driving the impedance load which, in this example, is antenna circuit 120 with inductor 120A and capacitor 120B arranged in series between two ports (depicted as ANTP and ANTN).

Sometimes this arrangement of transistors is referred to as "opposing-phase electronic switches." This follows as a first "ON phase" corresponds with current being driven along the top left branch, passing through the source-drain of transistor 102, to feed the ANTP port of the antenna circuit 120 at the same time current is returned from its ANTN port along the bottom right branch, passing through the source-drain of transistor 114. A second opposing phase, OFF phase, corresponds with current being driven along the top right branch, passing through the source-drain of transistor 104, to feed the ANTN port of the antenna circuit 120 at the same time current is returned from its ANTP port along the bottom left branch, passing through the source-drain of transistor 112. The activation and deactivation of each such transistor 102, 104, 112 and 114 is controlled by applying the appropriate control signal using a FET gate-control signal as generated by a respective one of four transistor-controlling signal amplifiers (or gate drivers) 122, 124, 132 and 134. Accordingly, for effecting the ON phase, transistors 102 and 114 are activated while transistors 104 and 112 are deactivated, and for effecting the OFF phase, transistors 104 and 112 are activated while transistors 102 and 114 are deactivated. As indicated conceptually in this example embodiment of FIGS. 1A and 1B, amplifiers (or gate drivers) 122, 124, 132 and 134 can be viewed as differential amplifiers themselves (or being driven by differential amplifiers) for providing (or receiving) signals in common mode, where the signals components are identical/balanced on both the positive (+) and negative (−) sides of the signals (as is common for use with differential amplifiers).

Also with reference to both FIGS. 1A and 1B, the energy passing through the antenna circuit 120 is shown at the bottom of the timing diagram of FIG. 1B, in the form of a sinusoidal waveform having cross-over points defined by the above-discussed ON and OFF phases involving transistors 102, 104, 112 and 114. The sinusoidal waveform can have any of various frequencies, such as in the tens of KHz or 25 kHz as might be the case when circuit 100 is used as a Class-D amplifier. The actual frequency is realized by using a (fixed) repetition time equal to the resonance frequency of the antenna circuit.

The upper waveform in FIG. 1B shows the ON and OFF phases alternating, as seen at the ANTP port of the antenna circuit 120 and with a magnitude reaching almost as high as VDR, which is the supply voltage of the circuit 100, and dropping to VSS, which is ground or common for the circuit 100. The middle waveform in FIG. 1B also shows the ON and OFF phases alternating but in the opposite direction as the upper waveform, and as seen at the ANTN port of the antenna circuit 120. It will be appreciated that the actual upper and lower voltages at ANTP port are offset by the voltage drop over the switches due to the impedance and current associated with the transistor(s) and the antenna circuit. For example, as seen at ANTP, the upper voltage is VDR minus the voltage drop over the transistor 102 due to the impedance in the transistor 102 and the current associated and the inductor 120A and the capacitor 120B.

Consistent with the instant disclosure, in such opposing-phase switching circuits, as exemplified in FIG. 1A, amplitude control is used to adjust the maximum supply voltage of the gate driver associated with the high-side switch. Another target application might permit or invite such opposing-phase FETs to include drivers (which create the gate-source voltages for each of four such FET switches) being controlled by the digital switch control signals; whereas the circuit 100 of FIG. 1A has gate-drivers 122 and 124 (associated with the high side switches at transistors 102 and 104) being supplied by a floating supply, referenced to the source of the transistors 102 and 104. The gate drivers associate with these high-side switches employ a special supply voltage (exceeding the VDR supply voltage) to provide high enough gate-source voltages on these high-side switches to ensure full turn-on of these switches. To this end and particular for setting this special supply voltage, a voltage-supply (Vdrout_set) control circuit is used for adjusting the maximum supply voltage of the high-switch associated gate driver.

As exemplified using Class-D type amplifier designs, FIG. 1A shows such a voltage-supply control circuit as supply control circuitry 150. The supply control circuitry 150 includes, for each of the gate drivers 122 and 124, a FET 153 or 157 and an impedance circuit (e.g., diode 152 or 156, and FET 154 or 158). Using the left branch for illustration purposes, the FET 153 has its gate terminal controlled by the corresponding impedance circuit so that the supply voltage to the gate driver 122 has its maximum supply voltage adjusted based on two (threshold) voltage drops respectively corresponding to the voltage drops effected by the serially-arranged components in the impedance circuit (diode 152 and FET 154). In this context, it would be appreciated that a single component or multiple components can be used to set or program the overall/accumulative magnitude of the voltage drop. Such setting may occur in the factory (e.g., by fixing the design with soldered-in place components) or on the fly, by way of a circuit that selects one or more voltage-dropping components in the impedance path as desired to affect the targeted magnitude of the voltage drop. It is also noted that the diode 152 (and similarly for the right side diode 156) is added to create the "maximum" function or effective voltage drop. This diode (or comparable component) can be used alone or with another component for the cumulative purpose mentioned above and/or also in the form of an NMOS FET as illustrated in order to compensate the threshold voltage of the NMOS FET source-follower generating the actual local supply voltage of the high-side gate driver (e.g., 122 or 124. This compensation is an option and in many instances, would not be used (depending on the specifications).

Accordingly, in such opposing-phase electronic switches, the transistors are configured and arranged to rapidly switch back and forth, subject to a controlled terminal-drive (gate) voltage, in response to an amplifier input signal and based on a power source defined to provide a special supply voltage used for the circuitry that drives the switching high-side transistors. By using an output-amplitude control circuit, the maximum-achievable gate voltage and a maximum-achievable source voltage for at least one of the opposing-phase electronic switches is limited, with each such controlled maximum voltage being less than the supply voltage provided by the power source.

Also illustrated in connection with the circuit 100 of FIG. 1A are two regulator circuits 166 and 168, one for each of the gate drivers 122 and 124, configured and arranged to clamp the maximum gate and source voltages of the high-side switches. The amplitude control circuitry 150 limits the maximum gate voltage of the high side switches and forces the high side switches to operate in common drain (source-follower) mode, if the Vdrout output amplitude level is set below the Vdddrv LF-driver supply voltage (as shown at the top rail of FIG. 1A). The two source voltage clamps therefore prevent that the source can be lifted above the defined Vdrout amplitude by the antenna flowing into the LF_Driver when operated with none 100% duty cycle or with a detuned antenna. For each ANTP/ANTN side, voltage source 172/

174 and limiting diode 171/173 is set/programmed to limit the maximum allowed high side gate driver supply voltage with respect to the LF_Driver ground node (VSSDRV).

These source-voltage clamps re-use the already present low-side switches to absorb current passing through the antenna circuit 120. This type of amplitude-control circuitry is also useful to realize common mode voltage ramping as discussed herein.

The gate drivers 122 and 12 can be supplied from the high-side driver supply rail, depicted as TXVDRHS in FIG. 1A, which is a dedicated supply rail that can be generated using a ChargePump on top of one of the driver-supply ports to ensure sufficient gate driver voltage headroom. Static bias currents are used inside or as part of the floating-gate driver-supply generation and are separate from the antenna currents to maximize the accuracy of the antenna current measurement.

Figure 2A:
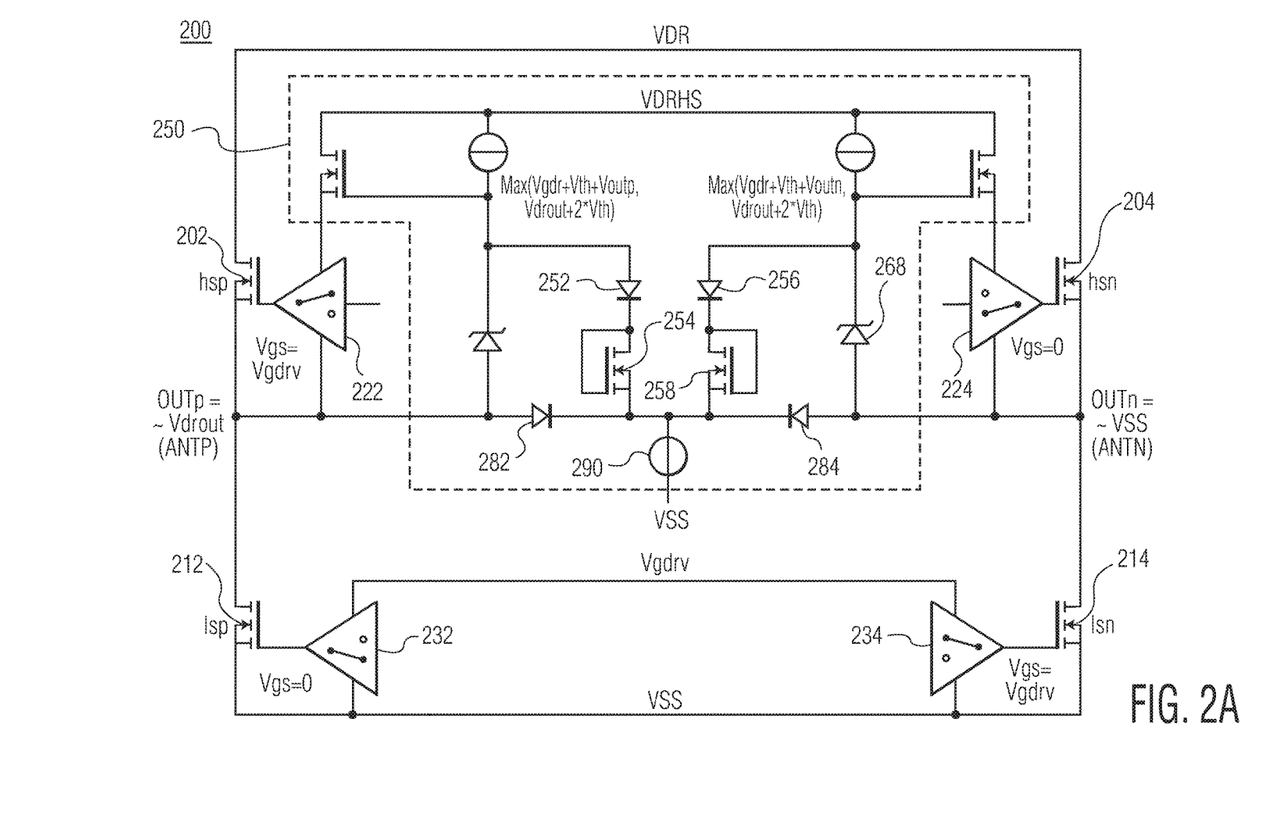
FIG. 2A is a block diagram of an example amplification circuit, in accordance with the present disclosure, which is consistent with the control circuitry exemplified in connection with FIGS. 1A and 1B.

Turning now to FIG. 2A, another amplifier circuit 200 is shown as yet another example embodiment consistent with further advancements of the instant disclosure. As with the circuit 100 of FIG. 1A, the amplifier circuit 200 of FIG. 2A includes amplitude-control aspects which can be use with a Class-D type driver implementation to adjust the maximum supply voltage of the gate driver circuitry associated with the high-side switch. Note that in the structures of the illustration described below, the closely-related or same circuitry, components and/or symbols having similar functions are denoted using similarly denoted reference numerals in the drawings, and description of such portions is not repeated.

In FIG. 2A, an additional Vdrout_set control circuit 250 is used to provide such adjustment, and the components and labeling of such structure tracks closely with the components and labeling used in FIG. 1A (e.g., reference numeral 150 corresponds with 250, 152 with 252, 154 with 254, etc.). As with the circuit 100 of FIG. 1A, the voltage supply terminals to the gate drivers (224 and 224) for the high-side FETs (202 and 204) 153 are controlled by the corresponding impedance circuit so that the supply voltage to the gate drivers have their maximum supply voltage adjusted based on a selected magnitude of voltage drop (e.g., two threshold voltage drops) effected by the serially-arranged component(s) in the impedance circuit (diode 252 and FET 254).

As an extension to the circuitry discussed above in connection with FIG. 2A, clamping circuitry can be added to absorb the returned antenna energy in the Vdrout reference voltage source, as also shown in FIG. 2A and depicted by diodes 282 and 284. Instead of using the inductive load (e.g., antenna circuit between ANTP and ANTN) to return energy back into the circuit 200 when the drive polarity is changed (ON phase to OFF phase, or OFF phase to ON phase). In the circuit 200 of FIG. 2A, this returned energy, is absorbed by the driver supply, as this energy will flow as current from the LF_Driver output through the back-gate diode (intrinsic part of the NMOS FET switches) to the LF_Driver supply node. In this context, diodes 282 and 284 conduct if the voltage across OUTp and OUTn (e.g., antenna circuit between ANTP and ANTN) raises above the Vdrout control voltage level, and thereby transferring the returned antenna energy to the Vdrout reference source. The indicated voltage source 290 at the drain of the pmost source-follower of the Vdrout reference circuit can be important to prevent turn-on of the low-side switching by the biasing current used to generate the reference voltage of the high-side gate driver floating supply. As with FIG. 1A, in FIG. 2A, activation and deactivation of the high-side transistors 202, 204 and low-side transistors 212 and 214 is controlled by applying the appropriate control signal using a FET gate-control signal as generated by a respective one of four transistor-controlling signal amplifiers (i.e., high-side drivers 222 and 224 and low-side gate drivers 232 and 234). Depending on specific applications, this type of implementation might require sufficient current sinking capabilities of the Vdrout reference source, which leads in practice to a larger die area.

The returned antenna energy can be absorbed in the low side switch(es), by turning-on these switch(es) as well, by a different implementation of the clamping circuit, as discussed previously with FIG. 1A.

Figure 2B:
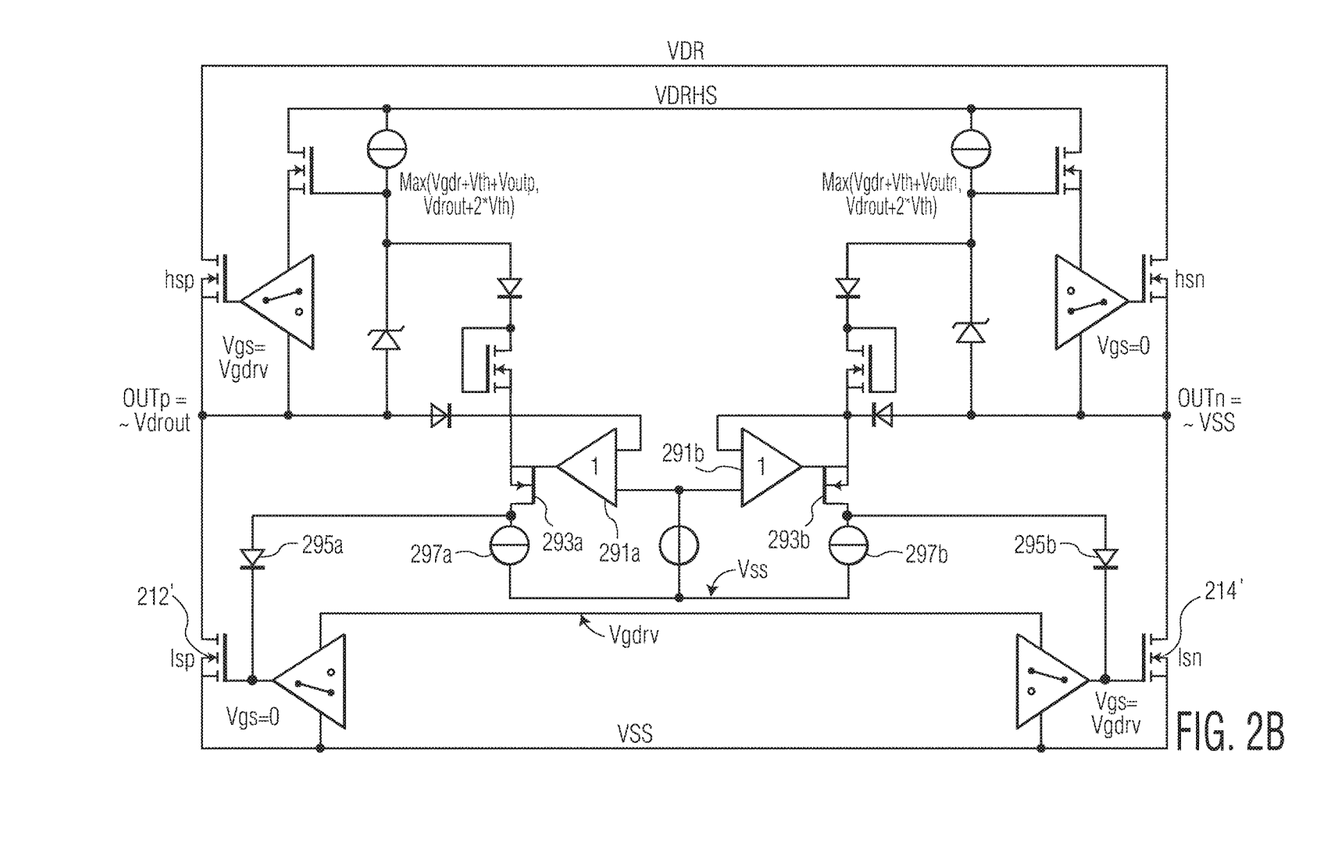
FIG. 2B is another block diagram showing an example alternative amplification circuit, relative to FIG. 2A, which is also in accordance with the present disclosure.

FIG. 2B is another alternative approach, relative to the above illustrations, which can also be useful for returned antenna energy absorption. More specifically, FIG. 2B is another block diagram showing an example amplification circuit which can be viewed as an alternative to the amplification circuit shown in FIG. 2A. The circuitry shown in FIG. 2B is identical to that shown and discussed above in FIG. 2A except for two sets of components (for the positive/left side and one for the negative/right side) shown between the antenna terminals (ANTP and ANTN). Using the set on the left (positive) side as being representative of each (the right side having opposite polarity), Again using an amplitude-controlled (Class-D) driver in this example switching amplification circuit, these components (specific to FIG. 2B) include amplifier 291a, FET 293a, diode 295a and voltage source 297a (with the set on the ride side having corresponding components amplifier 291b, FET 293b, diode 295b and voltage source 297b). With the inductive load being the LF antenna (between ANTP and ANTN), energy is returned back when the drive polarity of the LF_Driver is changed (on→off, or off→on). In FIG. 2B, this returned energy is absorbed in low-side switches 212' and 214' (using like numerals for corresponding low-side switches 212 and 214 of FIG. 1A), by turning-on these switches and by using a different type of clamping circuit as illustrated by the arrangement of the amplifier 291a, FET 293a and diode 295a, relative to the voltage source 297a. More specifically and again using the left side as being representative, the returned antenna energy will flow through the FET 293a (shown as a pmost source-follower) and through the diode 295a. In turn, this returned antenna energy increases the gate voltage of the associate low-side switch (212' of FIG. 2B), leading to turn-on of the low-side switch until the full antenna returned energy is absorbed in the low-side switch. In this context, it will be appreciated that the indicated pull-down current source at the drain of the FET 293a can be important as it is useful to prevent turn-on of the low-side switch 212' by the biasing current used to generate the reference voltage of the high-side gate driver floating supply.

Accordingly, such an amplitude controlled (Class-D) driver can include such a clamping circuit to absorb the returned antenna energy in the Vdrout reference voltage source using various approaches.

It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other types of depictions of circuits (e.g., whether or not using reference numerals or depicting a specific block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown by the sample and hold, adders, multipliers etc. in connection with the above figures. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described in connection with injection of the control signal and ensuing discussion of unity-gain detection and calibration as may be used by a programmable circuit (e.g., CPU and/or FPLA circuitry) to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

From the context of this disclosure, it will also be appreciated that certain terms may have some overlap in meaning. One example in this regard is the term an "electrode" which might be considered part of a "wire" does not limit a function of a component or the related circuitry. In many contexts, a design may characterize electrical connections with "electrode" being used as part of a "wiring" and in other designs, vice versa. Further, the term "electrode" or "wiring" can also mean a combination of a plurality of "electrodes" and "wirings" formed in an integrated manner. Also, when illustrating exemplary designs with use of a FET, the functions of the FET's source and drain might be switched depending on operation conditions and relative voltage polarities; for example, when a transistor having opposite polarity is employed or the direction of current flow is changed in circuit operation, reference to the term "source" or "source terminal" of the FET can be interchanged with "drain" or "drain terminal". Accordingly, the terms "source" and "drain" can be switched in this Specification, and similarly, these terms might also be used interchangeably with the terms "source/drain" and "drain/source".

Based upon the above discussion and illustrations of examples, those skilled in the art will recognize that various modifications and changes may be made to the various embodiments without strictly following the exemplary embodiments and applications illustrated and described herein. For example, methods as exemplified in the Figures may involve steps carried out in various orders with one or more aspects of the embodiments herein retained, and in many instances by combining circuitry/features with multiple aspects of the embodiments herein retained, and in other instances or implementations may involve fewer or more steps than those described herein. Such modifications do not depart from the true spirit and scope of various aspects of the disclosure, including aspects set forth in the claims.

What is claimed is:

1. A switching amplifier circuit comprising:
   first and second opposing-phase electronic switches, each respectively configured and arranged to rapidly switch back and forth in response to an amplifier input signal and based on a power source defined to provide a supply voltage to the switching amplifier circuit;
   an output drive circuit configured and arranged to provide an output drive signal in response to output signals from the first and second opposing-phase electronic switches; and
   an output-amplitude control circuit configured and arranged to limit at least one maximum-achievable voltage applied for at least one of the first and second opposing-phase electronic switches, wherein each said at least one maximum-achievable voltage is less than the supply voltage provided by the power source.

2. The switching amplifier circuit of claim 1, wherein the first and second opposing-phase electronic switches are part of a Class D amplifier, the output drive circuit is an impedance-based antenna drive circuit configured and arranged to convey signals wirelessly from the switching amplifier circuit for receipt by another circuit, and in operation, the at least one maximum-achievable voltage is applied for activating said at least one of the first and second opposing-phase electronic switches.

3. The switching amplifier circuit of claim 1, wherein the output drive circuit includes impedance circuitry having an inductor and being configured and arranged to convey modulated signals wirelessly from the switching amplifier circuit for receipt and demodulation by another circuit.

4. The switching amplifier circuit of claim 1, further including an automotive battery, wherein the output drive circuit includes an inductor and is configured and arranged to convey modulated signals wirelessly from the switching amplifier circuit for receipt and demodulation by another circuit in a manner that is susceptible to signal distortion caused by the first and second opposing-phase electronic switches rapidly switch back and forth, and wherein the output-amplitude control circuit is further configured and arranged to limit times during which the output drive circuit passes current while minimizing or controlling levels of the signal distortions.

5. The switching amplifier circuit of claim 1, further including an automotive battery, wherein the output drive circuit is configured and arranged to convey modulated signals wirelessly, at carrier frequency of at least ten kilohertz, from the switching amplifier circuit for receipt and demodulation by a key-fob circuit.

6. The switching amplifier circuit of claim 1, further including a load circuit inductively coupled to the output drive circuit, and further including a voltage clamping circuitry configured and arranged to prevent a source voltage to the first and second opposing-phase electronic switches from exceeding a maximum threshold defined for the switching amplifier circuit, by absorbing current returned by inductance in the load circuit.

7. The switching amplifier circuit of claim 1, further including a load circuit, including an antenna, inductively coupled to the output drive circuit, and further including a voltage clamping circuitry configured and arranged to prevent a source voltage to the first and second opposing-phase electronic switches from exceeding a maximum threshold defined for the switching amplifier circuit, by absorbing current returned by inductance in the load circuit.

8. The switching amplifier circuit of claim 1, wherein the output drive circuitry is configured and arranged to output voltage levels that are established, via programmable circuitry or set by voltage-level drop characteristics of circuit components, dependently from the supply voltage provided by the power source.

9. The switching amplifier circuit of claim 1, wherein the first and second opposing-phase electronic switches are configured and arranged to operate based on the power source providing a dedicated voltage supply, from which the switching amplifier circuit draws power.

10. A circuit comprising:
a switching amplifier including first and second opposing-phase electronic switches;
common mode circuitry configured and arranged to drive the first and second opposing-phase electronic switches in common mode via an amplifier input signal, wherein the first and second opposing-phase electronic switches are configured and arranged to rapidly switch back and forth in response to the amplifier input signal and based on a power source defined to provide a supply voltage to the switching amplifier circuit,
an output drive circuit configured and arranged as part of the switching amplifier to provide an output drive signal in response to output signals from the first and second opposing-phase electronic switches, and
an output-amplitude control circuit configured and arranged to limit a maximum-achievable gate voltage and a maximum-achievable source voltage for at least one of the first and second opposing-phase electronic switches, each of the maximum-achievable gate voltage and a maximum-achievable source voltage being less than the supply voltage provided by the power source.

11. The circuit of claim 10, further including a load circuit inductively coupled to the output drive circuit, and further including a voltage clamping circuitry configured and arranged to prevent a source voltage to the first and second opposing-phase electronic switches from exceeding a maximum threshold defined for the switching amplifier circuit, by absorbing current returned by inductance in the load circuit.

12. The circuit of claim 10, wherein the output drive circuitry is configured and arranged to output voltage levels that are programmable independently from the supply voltage provided by the power source.

13. The circuit of claim 10, wherein the output drive circuitry is configured and arranged to output voltage levels that are set by voltage-level drop characteristics of circuit components, independently from the supply voltage provided by the power source.

14. The circuit of claim 10, further including a voltage clamping circuitry configured and arranged to absorb energy returned in response to the output drive circuit via an inductively-coupled load circuit.

15. The circuit of claim 10, wherein the first and second opposing-phase electronic switches are configured and arranged to operate based on the power source providing a dedicated voltage supply, from which the switching amplifier circuit draws power.

16. A wireless communication arrangement comprising:
a power source configured and arranged to be driven by an automotive battery,
a key-fob circuit configured and arranged to receive and respond to modulated signals wirelessly;
a switching amplifier circuit including
first and second opposing-phase electronic switches, each respectively configured and arranged to rapidly switch back and forth in response to an amplifier input signal and based on power defined relative to the power source;
an antenna drive circuit configured and arranged to generate the modulated signals to the key-fob circuit in response to output signals from the first and second opposing-phase electronic switches; and
an output-amplitude control circuit configured and arranged to limit a maximum-achievable gate voltage and a maximum-achievable source voltage for at least one of the first and second opposing-phase electronic switches, each of the maximum-achievable gate voltage and a maximum-achievable source voltage being less than a supply voltage provided by the power source.

* * * * *